United States Patent [19]

Beranger et al.

[11] Patent Number: 5,442,641
[45] Date of Patent: Aug. 15, 1995

[54] FAST DATA COMPRESSION CIRCUIT FOR SEMICONDUCTOR MEMORY CHIPS INCLUDING AN ARRAY BUILT-IN SELF-TEST STRUCTURE

[75] Inventors: Herve Beranger, Fontainebleau; Frederic Joly, Paris, both of France; Stuart Rapoport, Washington, D.C.

[73] Assignee: International Business Machines Corporation, Armonk, N.Y.

[21] Appl. No.: 223,072

[22] Filed: Apr. 4, 1994

[30] Foreign Application Priority Data

Jun. 30, 1993 [EP] European Pat. Off. .......... 93480084

[51] Int. Cl.⁶ .......................................... G11C 29/00
[52] U.S. Cl. .................... 371/21.2; 371/27.5
[58] Field of Search ............ 371/21.2, 25.1, 21.1, 371/22.5, 21.3, 21.5

[56] References Cited

U.S. PATENT DOCUMENTS 5,173,906 12/1992 Dreibelbis et al. ................ 371/22.5
5,313,424 5/1994 Adams et al. ..................... 365/200

FOREIGN PATENT DOCUMENTS

473404A2 8/1991 European Pat. Off. .

OTHER PUBLICATIONS

"Dynamic Self-Repair Redundancy System" IBM Technical Disclosure Bulletin, vol. 34, #5, pp. 448-449, Oct. 1991.
Reddy et al. "A Data Compression Technique for Built in Self Test", IEEE Trans. on Computers vol. 37 No. 9 Sep. 1988 pp. 1151-1156.
Nagle et al. "Design for Testability and Built in Self Test: A Review" IEEE Trans. on Industrial Electronics, vol. 36, No. 2 May 1989 pp. 129-140.
Yan "Compact Testing with Intermediate Signature Analysis" 1991 IEEE VLSI for Symposium pp. 47-52.
Karpovsky et al. "Built in Self-Diagnostic by Space-Time Compression of Test Responses" IEEE VLSI Test Symposium 1992 pp. 149-154.
Gupta "Recent Advances in BIST" IEEE VLSI Test Symposium 1992 pp. 235-240.
Wu et al. "A Minimal Hardware Overhead BIST Data Compaction Scheme" ASIC Conference and Exhibit 1992 pp. 368-371.
Lampin et al. "Design and Application Trade-offs Between High-Density and High Speed ASICS" Computer Design-ICCD 1990 Int. Conf. pp. 269-272.

Primary Examiner—Robert W. Beausoliel, Jr.
Assistant Examiner—Joseph E. Palys
Attorney, Agent, or Firm—H. Daniel Schnurmann

[57] ABSTRACT

A fast high-density data compression circuit adapted to semiconductor integrated circuits of the memory type including an ABIST unit. This circuit, which compares the data-out signals output by the memory unit with the expected data generated by the ABIST unit to deliver a signal on a cycle by cycle basis, which is indicative of the fail/no fail status of the memory unit.

9 Claims, 5 Drawing Sheets

FAST DATA COMPRESSION CIRCUIT FOR SEMICONDUCTOR MEMORY CHIPS INCLUDING AN ARRAY BUILT-IN SELF-TEST STRUCTURE

FIELD OF THE INVENTION

The present invention relates to integrated circuits of the memory type having built-in self-test capabilities for logic and memory fault detection. It more particularly relates to a fast high density data compression circuit used therein.

BACKGROUND OF THE INVENTION

As memories grow faster, denser and more complex, there is an increased demand for ABIST (Array Built-In Self-Test) structures offering high speed and high test coverage, while at the same time consuming minimal area of a semiconductor chip. By way of example, FIG. 1 shows the block diagram architecture of a state of the art SRAM macro 10 provided with an ABIST unit 11. A similar architecture is described in U. S. Pat. No. 5,173,906 of common assignee. The functional units shown in FIG. 1, either form part of a stand-alone SRAM or the SRAM macro of a logic array of an integrated circuit chip. In the latter case, the chip may include a plurality of such macros, each provided with its own dedicated ABIST unit. The integrated circuit chip described is part of a wafer fabricated in a very large scale integration (VLSI) semiconductor technology and is presumed to be designed according to level-sensitive scan design (LSSD) rules.

As known to those skilled in the art, the SRAM macro 10 shown in FIG. 1 has three basic modes of operation: a SYSTEM mode, in which the SRAM macro 10 operates normally, i.e., where the memory unit 12 is either read or written, using the data-in signals DATAIN1 to DATAINM, the SRAM address signals ADDIN1 to ADDINP, and the read/write control signal R/WIN (where in M and P are, respectively, the bit widths of the data-in bus DATAIN and the SRAM address bus ADDIN). A second mode is required to satisfy LSSD requirements: the SCAN mode which is used for initializing/analyzing (SCAN-IN/SCAN-OUT) all the data of the latch pairs that form an LSSD chain. Finally, a third mode: the ABIST mode, in which the functionality of memory unit 12 is tested. It is a self-test which is first performed in a manufacturing environment before the chip is commercially released. A slightly different, more relaxed self-test is performed while the chip is incorporated in a system, for example, at the customer location, and thus in a system environment. As a result, the ABIST mode is used in different environments referred to hereinafter as the ABIST manufacturing sub-mode and the ABIST system sub-mode.

In the ABIST mode, according to the fundamentals of the self-test technique, the ABIST unit 11 generates a plurality of test vectors. Each test pattern consists of a set of deterministic 0's and 1's that are first written into memory unit 12, then read and compared with an expected pattern. The test pattern sequences play a key role in exercising the memory unit 12 to verify whether the memory unit 12 under best is functioning properly, i.e., to determine whether the READ and WRITE operations were successful. To that end, the ABIST unit 11 generates self-test data signals STDATA, self-test address signals STADD, and the self-test read/write control signal STRW.

Three groups of multiplexers select the signals to be fed to the memory unit 12. These include either the external signals mentioned above which are generated from outside the SRAM macro 10, namely, DATAIN1 ... DATAINM, ADDIN1 ... ADDINP, and R/WIN signals, or the internal self-test signals generated by the ABIST unit 11 mentioned above, namely, the STDATA, STADD, and STRW signals. The multiplexers forming these three groups are respectively referenced as 13-1 to 13-M, 13'-1 to 13'-P, and 13". The selection is made by the ABIST signal. Normally, external signals are selected when the ABIST signal is held at a logic "0", whereas signals that are internally generated by the ABIST unit 11 are selected when it is held at a logic "1". The ABIST signal thus allows the SRAM macro 10 to operate either in the SYSTEM mode or in the ABIST mode. The three groups of multiplexers 13-1 to 13-M, 13'-1 to 13'-P, and 13" form multiplexer block 13. The outputs of the first and second groups are labelled DATA bus and ADD bus, with M and P respective bit widths. The output of multiplexer 13" is a single line that carries the R/W control signal that determines the READ/WRITE operating mode of memory 12.

The data-out signals that are outputted by memory 12 are stored in a plurality of data-out L1/L2 pairs of latches (14-1 to 14-M) forming the data-out shift register 14. Generally, these data-out latch pairs are incorporated into memory 12. The data-out signals that are outputted by the L1 and L2 latches are labelled DATAOUT1 to DATAOUTM (DATAOUT bus) and DOUT1 to DOUTM (DOUT bus), respectively.

In the ABIST mode, after performing a READ operation, expected data signals labelled EXDATA are generated by the ABIST unit 11 on the EXDATA bus and are compared in the data compression unit 15 via data-out signals DOUT1 to DOUTM. Typically, only four test patterns are used on each word of the memory unit 12: alternate 0's and 1's, i.e., 0101 ... 01 and 1010 ... 10, all 0's and all 1's. Alternatively, there are only four self-test data signals, labelled STDATA0, STDATA1 and their respective complements. Because of the particular structure of these four test patterns, the data-out signals DOUT1 to DOUTM are divided into even and odd data-out signals. The even data-out signals that are outputted from the data-out shift register unit 14 are labelled DOUT2, DOUT4, ..., DOUT2j, and likewise, the odd data-out signals are labelled DOUT1, DOUT3, ..., DOUT(2j- 1), where j is an integer equal to M/2, assuming that M is an even number. Since all the even and odd numbered bits of the data-out signals have simultaneously the same '0' or '1' value, only two expected data signals are required, each one consisting of a single bit, EXDATA0 and EXDATA1. For instance, assuming the data-out signals to be read on the DOUT bus are: 010101 ... 01, the expected data signal EXDATA0 (for the even numbered bits) will be "1" and the expected data signal EXDATA1 (for the odd numbered bits) "0". EXDATA0 and EXDATA1 signals are thus the expected results for the even and odd data-out signals, respectively. Finally, data compression unit 15 generates a signal labelled RESULT which is held at a high logic level, namely, at "1", if a mismatch occurs during the comparison. By mismatch, it is to be understood that at least one data-out signal does not have the same logic value as its corresponding even or odd expected data generated by the ABIST structure 11. This mismatch is often caused by a defective word line in the memory unit 12 at a predetermined address. This mismatch is usually referred to as a "fail". Alternatively, if all data-out signals match the corresponding even or odd expected data signals (which means no fail is detected), the RESULT signal is held at the low logic level, i.e. at "0". The RESULT signal, which is often referred to as the FAIL FOUND LAST CYCLE signal, indicates after completing a READ operation, whether the memory unit 12 at the current address is defective. The RESULT signal is thus indicative of the fail/no fail status of memory unit 12 on a cycle by cycle basis. Another key component of the state of the art SRAM macro 10 is the fail register unit 16. It is required because, in the ABIST manufacturing sub-mode, the addresses of the defective word lines have to be identified, then memorized for subsequent use in the SYSTEM mode. When the RESULT signal is raised to a logic "1", indicating the presence of a failure, the word portion of the current address generated by the ABIST unit 11 on the STADD bus, labelled STADD*, is stored in a bank of pairs or latches of the fail address register 16. This stored word address thus corresponds to the address of a defective word line.

The ABIST unit 11 also generates a CNOOP (NOOP stands for NO OPERATION) signal to inhibit the ABIST self-test mode when the totality of the test pattern sequences has been fully exercised on memory 12. This signal is required when there is a plurality of SRAM macros embedded in a single semiconductor chip. These macros may have different sizes requiring different durations for their respective test. The CNOOP signal generated by the ABIST unit of each SRAM macro allows the memory units of all macros to be simultaneously tested.

Clocking the SRAM macro 10 is achieved using the standard procedures in accordance with LSSD rules. In state of the art architecture, a SRAM as illustrated in FIG. 1, clocking would normally be implemented by standard external LSSD clock signals labelled A, B, C, S, and CS (CHIP SELECT for a stand-alone SRAM chip or ARRAY SELECT for a SRAM macro). Note that the clock signal S, which is substantially the same as the clock signal B, is applied to the L2 latches of the latch pairs 14-1 to 14-M of the data-out shift register 14. In the ABIST manufacturing sub-mode, the clock and CS signals are derived from the tester. In the ABIST system sub-mode, these signals are derived from the system clock. The SCAN-IN (SI) signal is applied to the ABIST unit 11 according to standard LSSD rules, as illustrated in FIG. 1. However, for sake of simplicity, the SCAN-OUT signal generated by ABIST 11 in response to the SCAN-IN signal to be applied to the next latch pair, etc., along the whole LSSD chain, is not shown. In the following description, only latches will be referred to while it is clear, that according to LSSD rules, they are in reality latch pairs. All these signals are directly applied to ABIST 11 and/or to the memory 12, except for the clock C and CS signals. The clock signal C is applied to one input of a 2-way AND gate 17A. The CS signal is applied to one input of the 2-way AND gate 17B. The CNOOP signal is applied to the second input of AND gates 17A and 17B as a gating signal in order to block, when needed, the transmission of the respective clock C and CS signals. This occurs when the self-test has been completed in the ABIST mode and permanently in the SYSTEM mode. The A, B, and S clock signals are used during the SCAN mode, whereas the B, C, S and CS signals are used during the ABIST mode. The CS signal is used alone in the SYSTEM mode while the LSSD clock signals are held in a non-active state. Numeral 18 schematically illustrates the clock distribution scheme in the SRAM macro 10 and also includes the internal chip clock distribution network servicing it. This terminates the description of a state of the art SRAM macro provided with an ABIST structure. Because the data compression unit 15 performs the comparison between the data-out signals, i.e., between the data read from memory 12 and the expected data signals generated by ABIST 11, the SRAM macro 10 is an essential element to determine the integrity of the READ/WRITE operation. Moreover, as the cycle times of systems using such SRAM macros are reduced, there is a real need to perform this comparison at the highest possible speed. A conventional technique of data compression consists of comparing the data-out signals with the expected data signals, on a bit per bit basis, using exclusive-OR gates and ORing the result. This comparison is generally made using standard library logic books. Together with the four above mentioned test patterns, the data compression circuit 20 shown in FIG. 2, may be viewed as a typical implementation of a conventional data compression circuit to fit the data compression unit 15 of FIG. 1.

Referring now to FIG. 2, a first set of input terminals, labelled 21-1 to 21-2j, are connected to the outputs of the L2 latches of latch pairs 14-1 to 14-M (see FIG. 1), so that the data-out DOUT1 to DOUT2j (DOUTM) are respectively applied thereat. Two additional input terminals, labelled 22-1 and 22-2, forming a second set, are connected to ABIST 11, so that the EXDATA1 and EXDATA0 signals are respectively applied thereon.

The data compression circuit 20 thus consists of a plurality of 2-way XOR logic gates (as many XOR gates as there are data-out signals or bits), labelled 23-1 to 23-2j respectively, and one 2 j-way OR logic gate labelled 24. The first input of each 2-way XOR gate is connected to the corresponding circuit 20 input terminal and data-out signal. For instance, the first input of XOR gate 23-1 is connected to input terminal 21-1 where data-out signal DOUT1 is applied. The second input of each 2-way XOR gate is connected to either EXDATA0 or EXDATA1 signal. EXDATA0 signal is connected to the second input of XOR gates labelled 23-2, 23-4, . . . , 23-2j. Similarly, EXDATA1 signal is connected to the second input of XOR gates labelled 23-1, 23-3, . . . , 23-(2j-1). The 2j inputs to the 2 j-way OR gate 24 are connected to the 2j outputs of the 2-way XOR gates 23-1 to 23-2j. The RESULT signal is generated by the 2 j-way OR gate 24 and is available at output terminal 25-1. Operation of circuit 20 is relatively simple. Each of the odd data-out signals DOUT1, . . . , DOUT(2j-1) is compared to the signal EXDATA1 and each of the even data-out signals DOUT2, . . . , DOUT2j is compared to the signal EXDATA0 using an XOR tree. If there is a mismatch in at least one XOR gate 23-1 to 23-2j, the corresponding output thereof will be raised to "1", and the RESULT signal generated by 2 j-way OR gate 24 will be raised to "1", thereby indicating the existence of a fail in the READ operation.

Implementing the conventional data compression circuit 20 in the SRAM macro 10 of FIG. 1, whose memory 12 generates, say, 128 data-out signals, using a standard 0.8 micron CMOS technology would require about 1110 devices for a total of 171 logic books. What is important is that the path delay runs through 5 stages.

Indeed, the full set of XOR gates 23-1, ..., 23-2j accounts for one stage, while OR gate 24 accounts for four stages when broken down into elementary logic books, because of the high number of inputs (128). As a result, the total nominal delay of circuit 20 when implemented with the above 0.8 micron technology is about of 4.0 ns.

With the selected four test patterns of each memory word, all the even numbered bits of any data-out signals are simultaneously at the same '0' or '1' value. This is not very efficient to compare the data-out signals with the expected data signals in terms of circuit density, delay and fan-in. A similar reasoning applies to the odd numbered bits of the data-out signals. Each XOR gate, e.g., 23-1 of circuit 20, is rather complex, because it uses many devices. Moreover, circuit 20 has a large fan-in with respect to the expected data signals. For example, as apparent from FIG. 2, with 128 data-out signals, for each expected data, the fan-in is 64. This fan-in has a strong negative impact on the speed of circuit 20. As a result, circuit 20 is limited to memory units provided with a limited number of data-out signals and should the number thereof increase, it would no longer be operative.

OBJECTS OF THE INVENTION

Therefore, it is a primary object of the present invention to provide a data compression circuit designed for improved integration density and increased speed.

It is another object of the present invention to provide a data compression circuit with reduced fan-in and no limitations with respect to the number of data-out signals.

These objects will be accomplished in particular by an integrated circuit, such as an SRAM macro provided with an ABIST unit, which includes a fast high density data compression circuit comprising:

a first data compression block formed by:
  a first (j+1)-way OR gate to perform a Boolean addition of the first true expected data with the odd true data-out signals to generate a first intermediate output signal;
  a second (j+1)-way OR gate to perform a Boolean addition of the complement of the first true expected data with the complements of the odd true data-out signals to generate a second intermediate output signal; and
  a 2-way AND gate to perform a Boolean product between the first and second intermediate output signals to generate a first compressed output signal;
a second data compression block comprising:
  a first (j+1)-way OR gate to perform a Boolean addition of the second true expected data with the odd true data-out signals to generate a third intermediate output signal;
  a second (j+1)-way OR gate to perform a Boolean addition of the complement of the second true expected data with the complements of the odd true data-out signals to generate a fourth intermediate output signal; and
  a 2-way AND gate to perform a Boolean product between the third and fourth output intermediate signals to generate a second compressed output signal;
a summation block comprising:
  a 2-way OR gate to perform the Boolean addition of the first and second compressed output signals to generate the RESULT signal.

The above design may be extended to any number of expected data signals. Moreover, it is disclosed a preferred implementation of a fast high-density data compression circuit of the present invention in a BiCMOS technology, which inherently and efficiently performs a CMOS to ECL conversion and which restores a CMOS compatible signal. In general, this conversion is often a mandatory requirement in high performance circuits.

BRIEF DESCRIPTION OF THE DRAWINGS

The features believed to be characteristic of this invention are set forth in the claims. The invention itself, however, as well as other objects and advantages thereof will be best understood by reference to the following detailed description of an illustrated preferred embodiment to be read in conjunction with the accompanying drawings in which:

DESCRIPTION OF THE PREFERRED EMBODIMENTS

Figure 3:
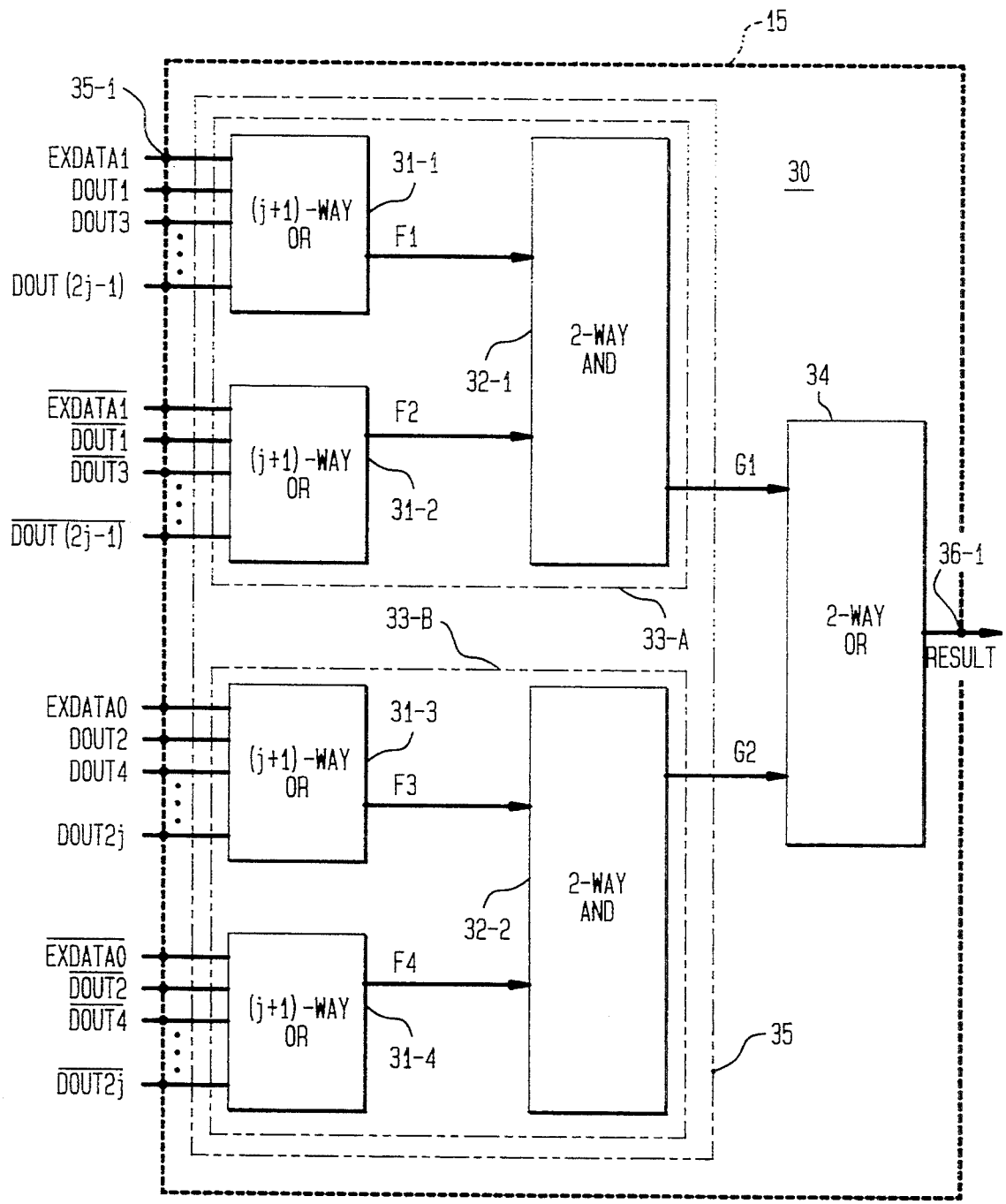
FIG. 3 shows the block diagram architecture of the novel data compression circuit of the present invention that fits the data compression unit 15 of FIG. 1.

Referring now to FIG. 3, there is shown a block diagram architecture of the data compression circuit 30 of the present invention, still adapted to the four test patterns mentioned above for testing each memory unit word. The input signals are now the data-out signals labelled DOUT1 to DOUT2j and their complements labelled $\overline{DOUT1}$ to $\overline{DOUT2j}$ on the one hand, and the even and odd expected data signals, respectively labelled EXDATA0 and EXDATA1 and their complements labelled $\overline{EXDATA0}$ and $\overline{EXDATA1}$ on the other. Generation of these complementary signals requires that the L2 latches of unit 14 generate the true and complement of each data-out signal and that the ABIST 11 generates the true and complement of each expected data signal. Circuit 30 comprises four (J+1)-way OR-gates labelled 31-1 to 31-4, two 2-way AND-gates labelled 32-1 to 32-2 and a 2-way OR-gate labelled 34. OR-gates 31-1, 31-2 and 2-way AND-gate 32-1 form block 33-A. Similar construction applies to OR-gates 31-3, 31-4 and 2-way AND gate 32-2 which form block 33B. Blocks 33A and 33B form main block 33. Input terminals and the single output terminal are respectively referenced as 35 and 36-1.

The input signals of the first (j+1)-way OR-gate 31-1 are DOUT1, DOUT3, ..., DOUT2J-1 and EXDATA1. The input signals of the second (j+1)-way OR-gate 31-2 are $\overline{DOUT1}$ $\overline{DOUT3}$, $\overline{DOUT(2j-1)}$ and $\overline{EXDATA1}$. The input signals of the third (j+1)-way OR-gate 31-3 are DOUT2, DOUT4, ..., DOUT2j and EXDATA0. The input signals of the fourth (j+1)-way OR-gate 31-4 are $\overline{DOUT2}$, $\overline{DOUT4}$, ..., $\overline{DOUT2J}$, and $\overline{EXDATA0}$. The signals that are outputted from OR-gates 31-1 to 31-4 are respectively labelled F1, F2, F3, and F4. F1 is thus a first intermediate output signal that performs a Boolean addition of the odd data-out signals with the true first expected data signal, i.e. F1 = (DOUT1 + ... + DOUT(2j-1) + EXDATA1) For instance, if EXDATA1 = "0" it just suffices to have at least one odd data-out signal at "1" to detect existence of a fail. The same reasoning applies to other intermediate output signals F2, F3, and F4.

The first and second inputs of the first 2-way AND gate 32-1 are connected to the respective outputs of the first and second (J+1)-way OR-gates 31-1 and 31-2. The first and second inputs of the second 2-way logical AND gate 32-2 are connected to the respective outputs of third and fourth (j+1)-way OR gates 31-3 and 31-4. The output signals of the two 2-way AND gates 32-1 and 32-2, labelled G1 and G2 respectively, are applied to the first and second inputs of 2-way OR gate 34. These signals are the respective Boolean products of intermediate output signals F1 and F2 on the one hand, and F3 and F4 on the other, i.e., G1=F1 . F2 and G2=F3 . F4. When output signal G1 = "1", it indicates the existence of a fail condition in the comparison between the EXDATA1 signal (and its complement) with the odd true data-out signals (and their complements) in a "compressed" manner. The same reasoning applies to output signal G2. The output signal supplied by the 2-way OR-gate 34 is the RESULT signal available at output terminal 36-1. The RESULT signal is thus the Boolean addition of compressed output signals G1 and G2. Consequently, circuit 30 requires only three stages and can be implemented with any logic gate at the only cost that complemented (out-of-phase) data-out and expected data signals are now required. Still, assuming a memory unit supplying 128 data-out signals, the first stage of circuit 30 is comprised of four 65-way OR gates 31-1 to 31-4. The second stage consists of two 2-way AND gates 32-1 and 32-2, and the final stage consists of a single 2-way OR gate 34.

Figure 2:
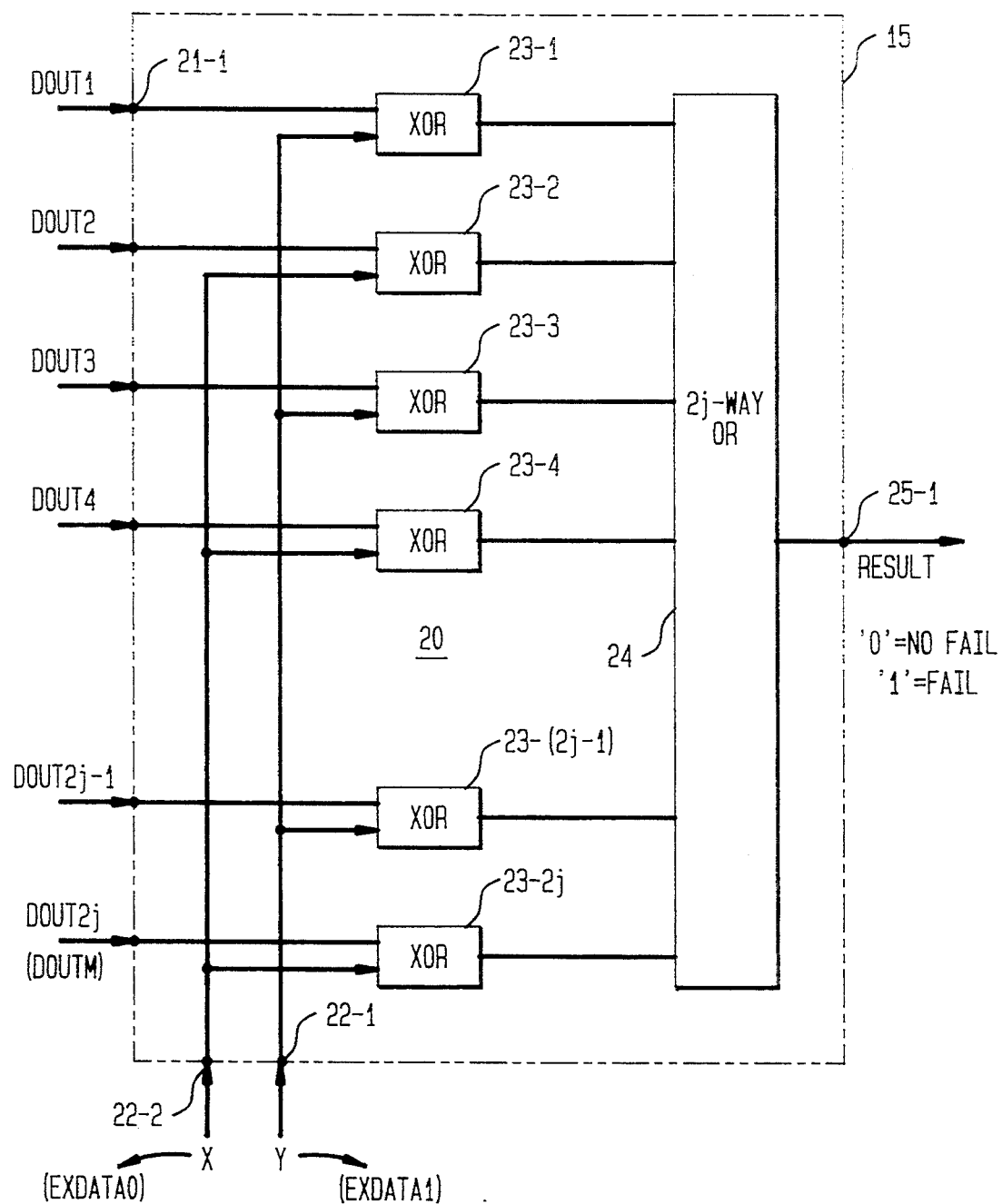
FIG. 2 shows the block diagram architecture of a conventional data compression circuit that fits the data compression unit 15 of FIG. 1.

FIG. 3 is the logic implementation of a preferred embodiment of the data compression circuit of the present invention, based on a different data compression technique with regard to the one described by reference to FIG. 2. In the instant case illustrated in FIG. 3, where there are two expected data and their complements (EXDATA0, $\overline{EXDATA0}$, EXDATA1, and $\overline{EXDATA1}$), the data-out signals are divided into four groups, respectively, the odd, complement odd, even, and complement even, data-out signals. However, this reasoning may be extended to any number of expected data signals.

An alternate logic implementation of the data compression circuit 30 can be readily obtained by changing the OR-gates ( e.g. 31-1 ) and AND-gates (e.g. 32-1 ) into NOR gates. The use of NOR gates would likewise show comparable short delays.

Figure 4:
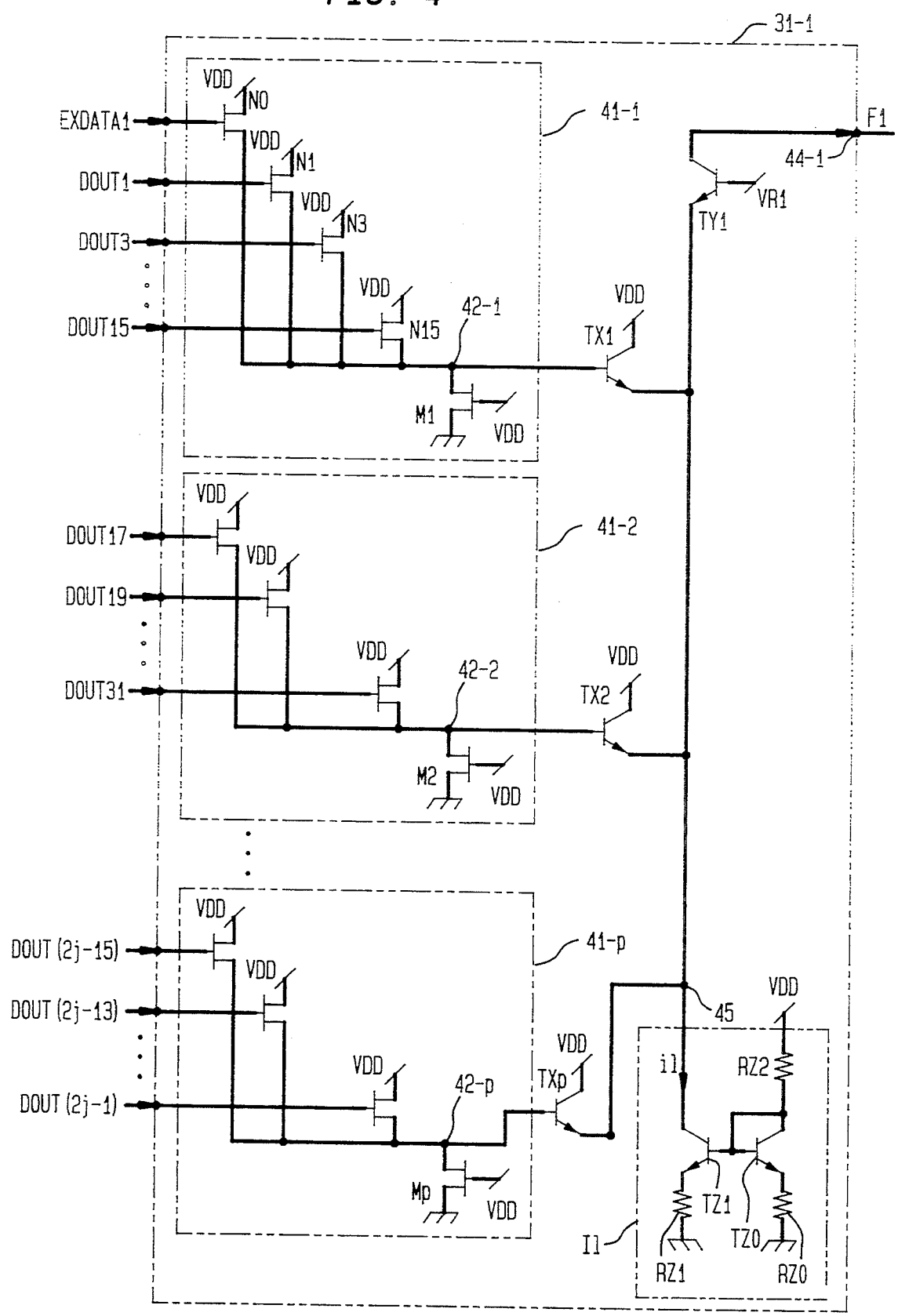
FIG. 4 shows a preferred embodiment of the implementation of the (j+1)-way OR gate of the circuit of FIG. 3 in BiCMOS technology.

The preferred circuit implementation of the (j+1)-way OR gate 31-1 of FIG. 3, which generates the F1 signal, is illustrated in FIG. 4. As apparent from FIG. 4, OR-gate 31-1 is of the current switch type. The same type of circuit may be used for OR-gates 31-2, 31-3, and 31-4 as well to generate the F2, F3 and F4 signals, respectively.

Now referring to FIG. 4, the J odd data-out signals DOUT1, DOUT3, DOUT5, ..., DOUT(2j−1) at the CMOS levels, are split into p groups and the EX DATA1 signal is added to the first group. For sake of illustration, to remain in line with the above assumption of M=128 (j=64) data-out signals, a value p=8 has been selected in the circuit implementation shown in FIG. 4. This value is determined to provide a compromise between the respective capacitances at nodes 42-1, ..., 42-p and 45, in terms of the performance of OR-gate 31-1. As apparent from FIG. 4, the (j+1)-way OR-gate 31-1 is thus split in p elementary OR-gates 41-1 to 41-p. Each signal is applied to the gate of an N-MOS field effect. transistor, referred to below, as an NFET. OR-gate 41-1 is formed by (j/p+1) NFETs referenced N0, N1, ..., N15. EXDATA1 signal is applied to the gate of NFET N0. Signal DOUT1 is applied to the gate of FET N1, etc., until signal DOUT15 which is applied to the gate of NFET N15. These NFETs have their drains attached to a first supply voltage VDD, and their sources to a common node 42-1. An OR function is thus realized. For adequate operation of OR gate 41-1, a load device consisting of NFET M1 is connected to common node 42-1. NFET M1 gate is connected to VDD and its source to the ground. NFET M1 acts as a current source to discharge the base of transistor TX1 during a down-going signal transition at node 42-1. This device must be sized large enough to quickly discharge the, node. It must be small enough to let the up-going signal transition reach a potential higher than VR1, even when a single data-out signal is rising. Finally, OR gate 41-1 forms the OR function of input signals EXDATA1, DOUT1, DOUT3, ..., DOUT15. OR gates 41-2 to 41-p are of similar construction except they add to eight NFETs instead of nine. Input terminals are generically referenced 43 and the single output terminal is referenced 44-1.

The common node 42-1, 42-2, ..., 42-p of each OR gate 41-1, ..., 41-p is connected to the base of a corresponding bipolar transistor TX1, ..., TXp. These bipolar transistors have their collectors connected to the supply voltage VDD and their emitters attached and dotted to the emitter of an output bipolar transistor TY1 at common node 45. The base of transistor TY1 is connected to a first reference voltage VR1 and its collector to output terminal 44-1, where the first intermediate output signal F1 is available. Bipolar transistors TX1, TX2, ..., TXp and TY1 form an emitter-coupled logic (ECL) OR function. The associated standard current source circuit I1 is formed by bipolar transistor TZ1 and resistance RZ1 mounted such that it mirrors the current defined by transistor TZ0 and resistances RZ0, RZ2. Bipolar transistor TZ0 base and collector are connected to each other, such that transistor TZ0 acts as a diode. Resistances RZ0 and RZ1 are tail resistors of small values as compared to resistance RZ2 which serve to compensate for unexpected I–V curve trackings between transistors TZ1 and TZ0. The current source circuit I1 shown in FIG. 4 is of a current-mirror type, which allows the use of a low value at reference voltage VR1, such that this implementation is less sensitive to supply voltage VDD in terms of circuit performance. Alternatively, the current source circuit I1 itself could be switched by the expected data (e.g. EXDATA1), allowing the use of a 64-way OR instead of a 65-way OR gate.

NFETs of OR gates 41-1, 41-2, ..., 41-p may be laid-out with common diffusion islands in order to reduce the parasitic capacitance attached to common nodes 42-1, 42-2, ..., 42-p. Many variances may be found. For example, PFETs (with their gate at ground)

may be used instead of NFETs M1 to Mp in OR gates 41-1 to 41-p to discharge transistors TX1 to TXp. Likewise, voltage clamp diodes may be added to limit the voltage swing above reference voltage VR1 at the bases of transistors TX1 and the like, to further improve the restore delay thereof. Finally, for each technology, it is possible to optimize the delay by choosing the most appropriate number of signals associated within a group, that is, by choosing the proper number of groups p. OR gate 31-1 construction allows intermediate output signal F1 to be delivered at output terminal 44-1 with a large swing and thus plays a key role in circuit 30, avoiding in particular the use of a level converter circuit therein.

Figure 5:
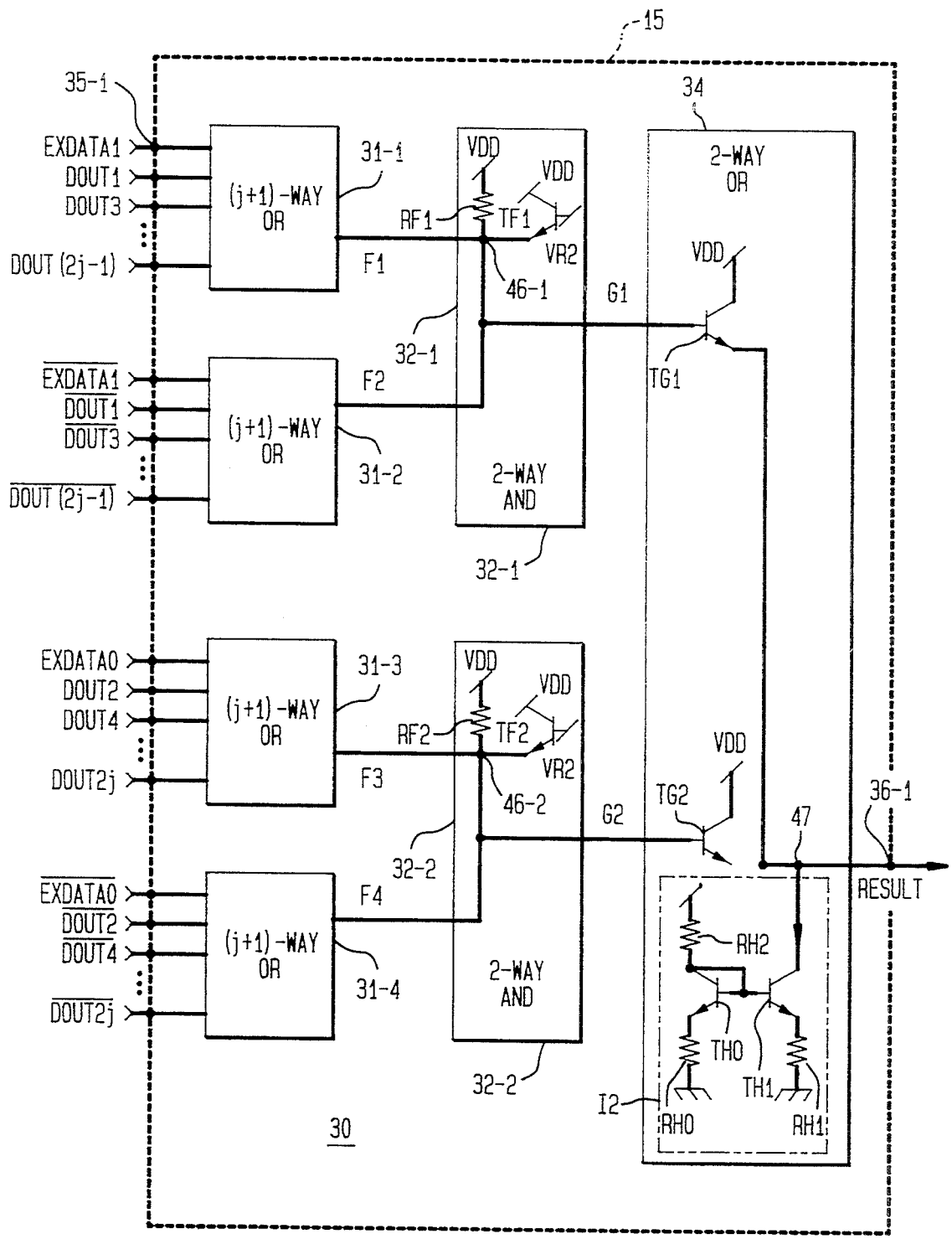
FIG. 5 shows a preferred embodiment of the implementation of the 2-way AND and 2-way OR logic gates of the circuit of FIG. 3 in BiCMOS technology.

Now referring to FIG. 5, the (j+1)-way OR gates 31-1 to 31-4 are represented by logic blocks, only gates 32-1, 32-2 and 34 are shown in details to illustrate a preferred circuit implementation thereof.

2-way AND gate 32-1 implements an AND function by the fact that the intermediate input signals F1 and F2, are ANDed by a common connection, often referred to as a wired-AND, (node 45-1). The RF1 resistance is the common load to the output of both OR-gates 31-1 and 31-2. In order to avoid saturation of output bipolar transistor of OR gates 31-1 (FIG. 4) and 31-2, a bipolar transistor TF1 is connected to this common node 46-1 by its emitter, its base is attached to a second reference voltage VR2 and its collector, to VDD. The compressed signal which is outputted from AND-gate 32-1, (labelled G1), is thus the resulting Boolean product of signals F1 and F2. The value of the second reference voltage VR2 is selected so that the down voltage of signals F1 or F2, is the lowest possible for a large swing signal, while avoiding transistor TY1 saturation. The same description applies to AND gate 32-2 which generates the compressed output signal G2 from the intermediate output signals F3 and F4.

In OR-gate 34, compressed signals G1 and G2 are respectively applied to the base of bipolar transistors TG1 and TG2, whose collectors are connected to VDD, and whose emitters are dotted at common node 47 connected to output terminal 36-1. An OR function is thus formed at output terminal 36-1 to generate the signal RESULT. There is a second standard current source circuit I2 associated with transistors TG1 and TG2, with transistors TH0, TH1 and resistors RH0, RH1 and RH2. These elements operate in a fashion similar to that of current source I1 of FIG. 4. Current I2 is shared between transistors TG1 and TG2, and the signal RESULT copies the highest potential at transistor bases TG1 and TG2, with a base-emitter voltage DC shift of 0.8V.

It is generally important to obtain a signal RESULT that is compatible with CMOS levels. To this end, using the notation VBE to mean the DC shift of approximately 0.8V between the base and the emitter of a bipolar transistor, the values of the reference voltages are: VR1=1.5×VBE =1.2 V, and VR2=2.5×VBE=2.0 V. This choice aims at avoiding saturation of transistors TY1, TZ1 of OR gate 31-1, and the like, in logic gates 31-2 to 31-4, (FIG. 5), while providing very low DC down levels at nodes 46-1 and 46-2. At these nodes, the down level is VR 2−VBE=1.2 V. At node 47, the down level is VR2−2 VBE=0.4 V, whereas the up level is VDD−VBE=VDD−0.8 V. As a result, both up and down levels at node 47, where the signal RESULT is available, have adequate levels to drive CMOS circuits.

Figure 1:
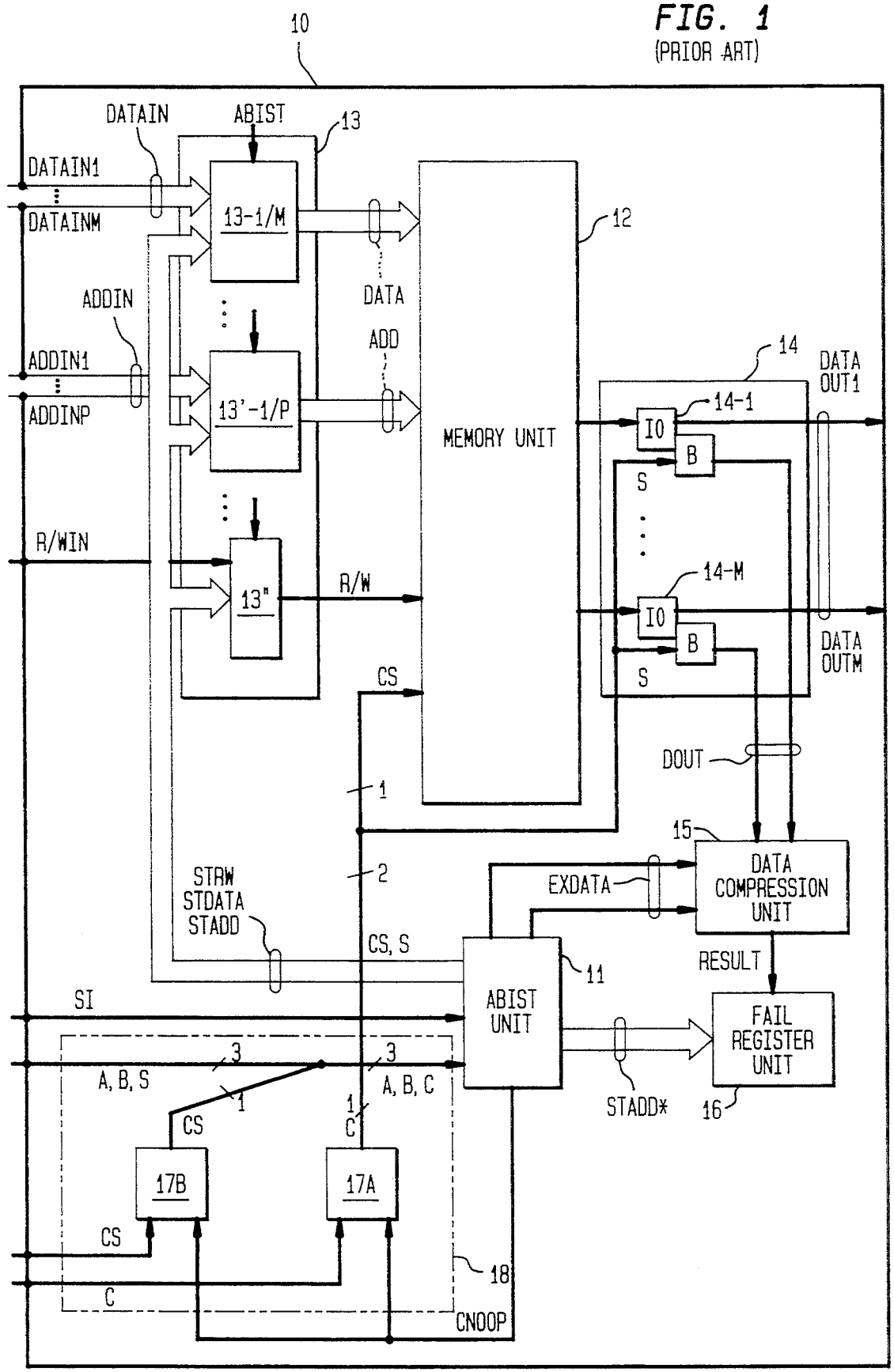
FIG. 1 shows the partial schematic view of the block diagram architecture of a prior art SRAM macro including an ABIST unit.

The advantages of the data compression circuit 30 of the present invention are listed hereafter:

1. In circuit 30, simple OR-gates replace the complex exclusive-OR circuits used in the prior art (FIG. 1), so that the logic complexity and the device count is significantly reduced. With the detailed implementations shown in FIGS. 4 and 5, circuit 30 of FIG. 3, uses less than 400 devices, and can be achieved with standard books. This finally results in a significant device saving of 710 devices.
2. The fan-in on expected data is diminished. For 128 data-out signals, the fan-in which was 64 for each expected data signal (FIG. 2), is now reduced to 1 or 2(2 if the complement of the expected data signal is to be generated by an inverter) with the data compression circuit 30 of the present invention.
3. The logic representation may be extended to a high number of data-out signals without any delay penalty, unlike circuit 20 which has obvious intrinsic limitations in that regard.
4. The new logic may be translated into a performant circuit implementation as illustrated by reference to FIGS. 4 and 5. The total path delay is now equivalent to three stages in series, instead of five, because of the breakdown of the 2j-way OR 24 of FIG. 2. As a matter of fact, it results in a very fast data compression circuit. For example, at VDD=3.6 V, still with 128 data-out signals, setting all I1, I2 current sources to 1 mA, the delays between the time the data-out signals are applied to circuit 30 and the delivering of the RESULT signal is typically below 0.8 ns, when using standard BiCMOS technology.
5. Although a BiCMOS technology is used as the core of circuit 30, the latter is fully adapted to CMOS levels, both for input (DOUT) and output (RESULT) signals.

In summary, the data compression circuit of the present invention is much faster and results in a significant reduction in device count. The fan-in of the expected data signal coming from the ABIST unit 11 is highly reduced (down to a value of 1 or 2), whereas it was previously equal to half the number M of the data-out signals.

Although the present invention has been described for SRAM macros, the processor based circuit 20 may find large applications in DRAMs, flash memories, etc., and stand alone SRAM chips.

Having thus described our invention, what we claim as new and desire to secure by Letters Patent is:

1. An SRAM macro comprising:

ABIST means for generating self-test data, address signals, a read/write control signal, and expected data signals;

memory means responsive to said self-test data, to said address signals, and to said read/write control signal, for generating data-out signals DOUT1, ... , DOUT2j, wherein j is a positive integer equal to one half the bit width of data inputted into said memory means;

data compression means for comparing said data-out signals with said expected data signals and for generating a primary output signal RESULT that is indicative of a fail/no-fail condition of said memory means on a cycle by cycle basis;

means for generating clock signals to properly sequence said SRAM macro and said generated ABIST signals to select an ABIST mode;

characterized in that said data compression means include a data compression circuit comprising:

first means for compressing a first true expected data signal EXDATA1 with odd true data-out signals DOUT1, ..., DOUT(2j-1) and a complement of said first expected data signal $\overline{\text{EXDATA1}}$ with complements of odd data-out signals $\overline{\text{DOUT}}$, ..., $\overline{\text{DOUT(2j-1)}}$ to generate a first compressed output signal G1, wherein G1=(EXDATA1+DOUT1+...+DOUT(2j-1)). ($\overline{\text{EXDATA1}}$+$\overline{\text{DOUT1}}$+...+$\overline{\text{DOUT(2j-1)}}$);

second means for compressing a second true expected data signal EXDATA0 with even true data-out signals DOUT2, ..., DOUT2j and a complement of said second true expected data signal $\overline{\text{EXDATA0}}$ with complements of even data-out signals $\overline{\text{DOUT2}}$, ..., $\overline{\text{DOUT2j}}$ to generate a second compressed output signal G2, wherein G2=(EXDATA0+DOUT2+...+DOUT2j). ($\overline{\text{EXDATA0}}$+$\overline{\text{DOUT2}}$+...+$\overline{\text{DOUT(2j-1)}}$); and ORing means for performing a Boolean addition of said first and second compressed output signals and for generating a primary output signal, wherein RESULT=G1+G2.

2. The SRAM macro as claimed in claim 1 wherein said first means for compressing further comprises:

first (j+1) way- OR means to perform a Boolean addition of the first true expected data signal with the odd true data-out signals and generate a first intermediate output signal F1, wherein F1=EXDATA1+DOUT1+...+DOUT(2j-1);

second (j+1) way- OR means to perform a Boolean addition of the complement of the first expected data signal with the complements of the odd data-out signals and generate a second intermediate output signal F2, wherein F2=$\overline{\text{EXDATA1}}$+$\overline{\text{DOUT1}}$+...+$\overline{\text{DOUT(2j-1)}}$; and, first ANDing means to perform a Boolean product of the first and second intermediate output signals and generate said first compressed output signal G1, so that G1=F1 . F2.

3. The SRAM macro as claimed in claim 2 wherein said first OR means is driven by said first true expected data signal and said odd true data-out signals.

4. The SRAM macro as claimed in claim 3 wherein said second means for compressing comprises:

third OR means to perform a Boolean addition of the second true expected data signal with the even true data-out signals and generate a third intermediate output signal F3, so that F3=EXDATA0+DOUT2+...+DOUT2j;

fourth OR means to perform a Boolean addition of the complement of the second expected data signal with the complements of said even data-out signals and generate a fourth intermediate output signal F4, wherein F4=$\overline{\text{EXDATA0}}$+$\overline{\text{DOUT2}}$+...+$\overline{\text{DOUT2j}}$; and, second ANDing means to perform a Boolean product of said third and fourth intermediate output signals to generate said second compressed output signal G2. so that G2=F3 . F4.

5. The SRAM macro as claimed in claim 4 wherein said third OR means further comprises a (j+1)-way OR gate driven by said second true expected data signal and said even true data-out signals.

6. The SRAM macro as claimed in claim 3 wherein said (j+1)-way OR gate further comprises:

a plurality p of MOS FETS current switches wherein p is a factor indicative of the performance of the current switch, and wherein the first of said p current switches has j/p+1 input terminals driven by the first expected data signal and by a first group of j/p odd true data-out signals and its output is connected to the base of a bipolar transistor mounted in an emitter follower configuration;

the remaining (p-1) of said current switches have j/p input terminals, each being driven by a group of j/p odd true data-out signals, each output of said remaining (p-1) current switches is connected to the base of a corresponding bipolar transistor mounted in an emitter follower configuration; and a driving bipolar transistor mounted in a common base configuration, said base is connected to a first reference voltage and its emitter is dotted with the emitters of the transistors and having a first current source circuit supplying the first intermediate output signal on its collector at the output terminal.

7. The SRAM macro as claimed in claim 4 wherein said first AND means further comprises:

dotting means that includes a load resistor to perform an AND function at a dotting node, wherein said first compressed output signal is available.

8. The SRAM macro as claimed in claim 7 wherein said dotting means further comprises antisaturation means connected to said common node.

9. The SRAM macro as claimed in claim 8 wherein said ORing means comprise of two transistors mounted in an emitter follower configuration, said bases are connected to their respective common nodes and said emitters are dotted with a second current source to generate said primary output signal RESULT.

* * * * *